US005507978A

United States Patent [19]
Honda

[11] Patent Number: 5,507,978
[45] Date of Patent: Apr. 16, 1996

[54] NOVOLAK CONTAINING PHOTORESIST STRIPPER COMPOSITION

[75] Inventor: Kenji Honda, Barrington, R.I.

[73] Assignee: OCG Microelectronic Materials, Inc., West Paterson, N.J.

[21] Appl. No.: 436,549

[22] Filed: May 8, 1995

[51] Int. Cl.$^6$ .................... B08B 7/00; C09D 9/00; C11D 3/44

[52] U.S. Cl. .................... 252/544; 252/153; 252/162; 252/171; 252/174.23; 252/DIG. 8; 134/2; 134/38; 430/260; 430/329; 430/331

[58] Field of Search .................... 252/153, 162, 252/171, 544, DIG. 8, 174.23; 134/38, 2; 430/260, 329, 331

[56] References Cited

U.S. PATENT DOCUMENTS

| | | | |
|---|---|---|---|
| 3,582,401 | 6/1971 | Berilla et al. | 134/3 |
| 4,015,986 | 4/1977 | Paal et al. | 96/36 |
| 4,617,251 | 10/1986 | Sizensky et al. | 430/256 |
| 4,770,713 | 9/1988 | Ward | 134/38 |
| 4,786,578 | 11/1988 | Neisius et al. | 430/256 |
| 4,824,762 | 4/1989 | Kobayashi et al. | 430/258 |
| 4,824,763 | 4/1989 | Lee | 430/258 |
| 4,904,571 | 2/1990 | Miyashita et al. | 430/331 |
| 5,102,777 | 4/1992 | Lin et al. | 430/331 |
| 5,145,717 | 9/1992 | Drury | 427/96 |
| 5,279,791 | 1/1994 | Lee | 252/548 |
| 5,308,745 | 5/1994 | Schwartzkopf | 430/329 |
| 5,334,332 | 8/1994 | Lee | 252/548 |
| 5,472,830 | 12/1995 | Honda | 430/331 |

FOREIGN PATENT DOCUMENTS

| | | |
|---|---|---|
| 3828513 | 3/1990 | Germany . |
| 56-115368 | 9/1981 | Japan . |
| 63-208043 | 8/1988 | Japan . |
| 1-081949 | 3/1989 | Japan . |
| 64-088548 | 4/1989 | Japan . |
| 4-124668 | 4/1992 | Japan . |
| 4-350660 | 12/1992 | Japan . |
| 5-045894 | 2/1993 | Japan . |

*Primary Examiner*—Linda Skaling Therkorn
*Assistant Examiner*—Gregory R. Delcotto
*Attorney, Agent, or Firm*—William A. Simons

[57] ABSTRACT

A noncorrosive photoresist composition containing:
(a) 20–70% by weight of an organic polar solvent having a dipole moment of more than 3.5;
(b) 70–20% by weight of selected amine compounds;
(c) about 0.01% to about 1% by weight of novolak resin having a weight-average molecular weight ($M_w$) from about 200 to about 5,000;
(d) optionally 0–10% by weight of selected amino acid having a hydroxyl group; and
(e) optionally 0–10% by weight of water.

9 Claims, No Drawings

NOVOLAK CONTAINING PHOTORESIST STRIPPER COMPOSITION

BACKGROUND OF THE INVENTION

1. Field of the Invention

The present invention relates to a non-corrosive photoresist stripper composition containing the combination of (1) selected solvents; (2) selected amines; (3) selected novolak resins; optionally (4) selected corrosion inhibitors; and (5) optional water.

2. Description of the Prior Art

The photoresist stripper art is replete with numerous references to stripper combinations containing both a polar solvent and an amine compound. The presence of an amine in photoresist stripper compositions has been judged to be essential to effectively remove cross-linked resist films. However, amine-type photoresist strippers sometimes have a serious problem of corrosion, especially with aluminum substrates.

It is believed that the corrosion is caused in part by the ionization of water with the amine in post-stripping water rinses, as residual stripper solution may be retained on the substrate surface and/or substrate carrier after the stripping step. In other words, the amine component of the stripper composition does not corrode the substrate by itself, but may trigger water to cause the corrosion.

To solve this problem, an intermediate rinse step with an organic solvent has been used between the stripping step and the post-stripping rinse with water. For example, isopropyl alcohol is known to be useful for this purpose. However, such intermediate rinses are not necessarily desirable because overall stripping operation becomes more complicated and, furthermore, an additional solvent waste is produced. Accordingly, if amine-type strippers are to be further employed, there is a need to solve this corrosion problem without intermediate organic solvent washes.

Furthermore, particle and metal contaminations of the surface of the underlying substrate should be as low as possible after the stripping operation, because these contaminations always result in a short life of the device. Desirably, the metal contamination of the substrate surface should be below about $10^8$ metal atoms per square centimeter.

To achieve this goal, it is important to use an initial stripping solution with the lowest possible particle and metal contents. The metal level of the substrate surface, for example, could be undesirably high if the photoresist material or other organic polymeric material being removed contains a high level of metals, because a portion of such metals may be left behind on the substrate surface after stripping. However, even if the metal level in the stripper composition were low enough, the metal contamination at the substrate surface after stripping operation may still be undesirably high because of corrosion caused by the stripper solution or post-stripping aqueous rinses.

In order to solve the above problems, it has been suggested to add corrosion inhibitors to the stripper solution. See U.S. patent application Ser. No. 08/288,775, filed Apr. 18, 1994 with Kenji Honda as the named inventor. That patent application is incorporated herein by reference in its entirety. In fact, the presence of certain corrosion inhibitors in a stripper solution does decrease the metal contamination at the substrate surface. But, because metallic contamination is not limited to the corrosion caused by the stripper solution, that approach will not prevent all metal contamination. In addition, the particle contamination cannot be reduced by this technology of corrosion inhibitors.

Illustrative of references suggesting photoresist stripper compositions containing the combination of a polar solvent and an amine compound are the following:

1. U.S. Pat. No. 4,617,251, which issued to Sizensky et al. (Olin Hunt) on October 14, 1986, teaches a positive photoresist stripping composition containing (A) selected amine compound (e.g., 2-(2-aminoethoxy)ethanol; 2-(2-aminoethylamino)ethanol; and mixtures thereof) and (B) selected polar solvents (e.g., N-methyl-2-pyrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

2. U.S. Pat. No. 4,770,713, which issued to Ward (J. T. Baker) on Sep. 13, 1988, teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N,N-diethyl butyramide and N-methyl-N-ethyl propionamide) and (B) selected amine compound (e.g., monoethanolamine, monopropanolamine, methylaminoethanol). The patent also teaches this stripper may optionally contain a water miscible nonionic detergent (e.g., alkylene oxide condensates, amides and semi-polar nonionics).

3. U.S. Pat. No. 4,786,578, which issued to Neisius et al. (Merck) on Nov. 22, 1988, teaches a rinse solution used after a photoresist stripper, said rinse solution containing (A) a nonionic surfactant (e.g., ethoxylated alkylphenol, fatty and ethoxylate, fatty alcohol ethoxylate or ethylene oxide/propylene oxide condensate) and (B) an organic base (e.g., mono-, di-, or tri-ethanolamine).

4. U.S. Pat. No. 4,824,762, which issued to Kobayashi et al. on Apr. 25, 1989, teaches photoresist stripping post-rinse solution containing (A) glycol ether (e.g., diethylene glycol monomethyl ether, dipropylene glycol monomethyl ether, tripropylene glycol monomethyl ether) and (B) an aliphatic amine (e.g., monoethanolamine or triisopropylamine).

5. U.S. Pat. No. 4,824,763, which issued to Lee (EKC) on Apr. 25, 1989, teaches positive-working photoresist stripping composition containing (A) triamine (e.g., diethylenetriamine) and (B) a polar solvent (e.g., N-methyl-2-pyrrolidone, dimethylformamide, butyrolactone, aliphatic hydrocarbons, aromatic hydrocarbons, chlorinated hydrocarbons).

6. U.S. Pat. No. 4,904,571, which issued to Miyashita et al. on Feb. 27, 1990, teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium amines, sulfonium hydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, and morpholine borone).

7. U.S. Pat. No. 5,279,791, which issued to Lee (EKC) on Jan. 18, 1994, teaches a stripping composition for removing resists from substrates containing (A) hydroxylamine (e.g., NH$_2$OH); (B) at least one alkanolamine; and optionally (C) at least one polar solvent.

8. U.S. Pat. No. 5,334,332, which issued to Lee (EKC) on Aug. 2, 1994, teaches the use of ethylenediamine tetraacetic acid and 1,2-dihydroxybenzene as a chelating reagent to reduce the surface metal contamination on waters.

9. German Published Patent Application No. 3828513, which published on Mar. 1, 1990 and is assigned to Merck patent GMBH, teaches a positive and negative photoresist stripper composition containing (A) an aprotic polar solvent (e.g., 1,3-dimethyl-2-imidazolidinone or 1,3-dimethyl-tetrahydro-pyrimidinone); and (B) an organic base (e.g., alkanolamine).

10. Japanese Published Patent Application No. 56-115368, which was published on Sep. 10, 1981 and is assigned to San Ei Chemical Industries, KK, teaches a photoresist stripping composition containing (A) nonionic surface activator (e.g., a polyethylene glycol ether); (B) organic solvent (e.g., cyclohexanone); and (C) either a swelling agent (e.g., polyethylene glycol) or penetrant (e.g., 2-aminoethanol).

11. Japanese Published Patent Application No. 63-208043, published on Aug. 29, 1988, teaches a positive-working photoresist stripper composition containing (A) 1,3-dimethyl-2-imidazolidinone; (B) a water-soluble organic amine (e.g., monoethanolamine, 2-(2-aminoethoxy)-ethanol, triethylene(tetramine). The application also teaches a surfactant may be added to the stripper.

12. Japanese Published Patent Application No. 1-081949, which published on Mar. 28, 1989 and is assigned to Asahi Chemical, teaches a positive-working photoresist stripper composition containing (A) gamma-butyrolactone, N-methyl-formamide, N,N-dimethylformamide, N,N-dimethylacetoamide or N-methylpyrrolidone; (B) an amino alcohol (e.g., N-butyl-ethanolamine and N-ethyldiethanolamine); and (C) water.

13. Japanese Published Patent Application No. 4-350660, which is assigned to Texas Instruments, Japan and Kanto Chemical, Inc., teaches a stripper for positive photoresists comprising (A) 1,3-dimethyl-2-imidazolidinone, (B) dimethylsulfoxide, and (C) a water-soluble amine (e.g., monoethanolamine or 2-(2-aminoethoxy)ethanol wherein the amount of the water-soluble amine is 7–30% by weight.

14. Japanese Published Patent Application No. 5-045894, which issued to Ward (ACT, Inc.) on Feb. 26, 1993, teaches the use of 6-hydroxyquinoline as a chelating corrosion inhibitor in a positive photoresist stripper.

In particular, recently the approach with chelating reagents to reduce the surface metal contamination has attracted much attention. However, most of the compounds so far used have several problems like a poor solubility in a stripper solution, a strong acid/base reaction with a stripper component, enhancement of the corrosion, or a higher toxicity.

BRIEF SUMMARY OF THE INVENTION

The present invention, therefore, is directed to a resist stripper composition comprising:

(a) from about 20 to about 70% by weight of an organic polar solvent having a dipole moment of more than 3.5;

(b) from about 70 to about 20% by weight of an amine compound selected from the group consisting of compounds having the formula (I):

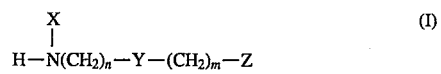

wherein n and m are each independently an integer ranging from 0–5, inclusive; X is hydrogen, alkyl, or alkoxy group; Y is either —O— or —NH—; and Z is hydrogen, —OH, or —NH$_2$;

(c) about 0.01% to about 1% by weight of novolak resin having a weight-average molecular weight (Mw) from about 200 to about 5,000;

(d) optionally from about 0 to about 10% by weight of an amino acid selected from the group consisting of compounds having the formula (II):

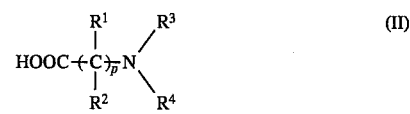

wherein p is an integer ranging from 1–3; R$^1$ and R$^2$ are each independently selected from the group consisting of hydrogen and compounds having the formula (III):

wherein R$^5$, R$^6$, and R$^7$ are each independently selected from hydrogen, —OH, —CH$_2$OH, alkyl, alkoxy phenyl, mono-, di-, or tri-hydroxysubstituted phenyl groups; and R$^3$ and R$^4$ are each independently selected from the group consisting of hydrogen and compounds having the formula (IV):

wherein X', Y', and Z' are each independently selected from hydrogen, —OH, —CH$_2$OH, —CH$_2$CH$_2$OH, —CH$_2$COOH, alkyl, or alkoxy group, and at least one of them is —OH, —CH$_2$CH$_2$OH, or —CH$_2$OH; and (e) optionally from about 0 to about 10% by weight of water.

DESCRIPTION OF THE PREFERRED EMBODIMENTS

As stated above, the non-corrosive stripper of the present invention has three critical components, namely:

(a) a polar solvent having a dipole moment of more than 3.5;

(b) an amine;

(c) a novolak oligomer having Mw in the range from 200 to 5,000; and optionally, (d) an amino acid having at least one hydroxyl group; and, further optionally, (e) water as a solution stabilizer.

The solvent used in this stripper composition should have a good solubility for cross-linked resist films. Therefore, a solvent is necessary to efficiently remove cross-linked resist films which are strongly adhering to the substrate. The solvent should meet the following criteria:

(1) Its dipole moment should be more than 3.5.

(2) Its boiling point should be more than 130°–180° C.

(3) Its flash point should be more than 60°–90° C.

Among various candidates, amides are particularly preferred. In particular, cyclic amides such as N-alkyl-2-pyrrolidones (e.g., N-hydroxyethyl-2-pyrrolidone) and 1,3-dialkyl-2imidazolidinones are especially preferable from a view point of stripping power and toxicity. A suitable solvent mixture may be an admixture of N-hydroxyethylpyrrolidone (HEP) and 1,3-dimethyl-2-imidozolidinone (DMI) wherein the mixing ratio of HEP:DMI is from about 95:5% to about 5:95% by weight as HEP is a known safer solvent and DMI is a powerful stripping solvent.

As mentioned above, another critical component of the stripper is an amine compound. Alkanolamines are particularly preferable. But an amine cannot efficiently dissolve cross-linked resist films by itself, probably because of its high viscosity.

Various amines can be used in the stripper composition of this invention. Particularly, amines having at least one hydroxyl group, so-called alkanolamines, are the most preferable; for example, monoethanolamine, 2-(2-aminoethoxy-)ethanol, 2-(2-aminoethylamino)ethanol, and the like.

The third essential component of the present invention is a novolak resin having a weight average molecular weight (Mw) from about 200 to about 5,000. Such novolak resins have unexpectedly been found to reduce the particle and metal levels at the substrate surface when added in an appropriate amount to the stripper composition which is in the range from about 0.01% to about 1% by weight to the stripper solution.

Any type of novolak resin structure within the above molecular weight range is believed to be suitable. Preferably, the novolak may be any addition-condensation product of one or more monomeric phenols (e.g., phenol, o-cresol, m-cresol, p-cresol, 2,3-xylenol, 2,5-xylenol, 3,5-xylenol, 2,3,5-trimethylphenol, and admixtures thereof) with a suitable aldehyde source (e.g., formaldehyde, paraformaldehyde, benzaldehyde, acetaldehyde, or mixtures thereof).

These novolak resins are believed to have the following advantages:

(a) specific affinity to metal ions due to the novolak backbone;

(b) good solubility in stripper solution;

(c) surfactant activity due to the oligomeric structure; and (d) high efficiency to permeate and swell cross-linked photoresist films which adhere to the substrate with a hard skin layer.

An optional component of the stripper composition of this invention is a selected amino acid compound working as a corrosion inhibitor. Examples of compounds within this class include: tricine, bicine, DL-homoserine, D-homoserine, L-homoserine, DL-threonine, D-allo-threonine, L-allothreonine, D-threonine, L-threonine, DL-3-hydroxynorvaline, DL-metathroxine, D-4-hydroxyphenylglycine, DL-tyrosine, D-tyrosine, L-tyrosine, 3-nitro-L-tyrosine, 3-(3,4-dihydroxyphenyl)-DL-alanine, 3-(3,4-dihydroxyphenyl)-L-alanine, 3-(2,4,5-trihydroxyphenyl)-DL-alanine, DL-alpha-methyltyrosine, L-alphamethytyrosine, (–)-3-(3,4-dihydroxyphenyl)-2-methyl-L-alanine, DL-threo--3-phenylserine, DL-threo-3,4-dihydroxyphenylserine, and the like. Preferable candidates among them are tricine, bicine, 3-(2,4,5-trihydroxyphenyl)-DL-alanine, and DL-threo-3,4-dihydroxyphenylserine, in terms of cost/performance balance.

Examples of compounds outside the formula (II) which may be also useful for this function include: DL-4-amino-3-hydroxybutyric acid, (3's, 4's)-(–)-statine, (+)-muramic acid, 5-hydroxy-DL-lysine, cis-4-hydroxy-D-proline, cis-4-hydroxy-L-proline, trans--4-hydroxy-L-proline, mimosine, N-(4-hydroxyphenyl)glycine, 3,3'5-triiodo-L-thyronine, D-thyroxine, L-thyroxine, D-4-hydroxyphenylglycine, 3-nitro-L-tyrosine, 3-amino-L-tyrosine, 3,5-dinitro-L-tyrosine, chloroacetyl-L-tyrosine, N-acety-1-tyrosinaminde, and the like.

It has been found that the presently claimed amino acid compound of formula (II) can effectively inhibit corrosion without any damage of the stripping power of the claimed amines. For example, it is believed that amino acids having hydroxyl groups can form a complex with amines in stripper solutions to reduce basicity of stripper solution. This results in retardation of the corrosion.

Another optional component of the stripper composition of this invention is water (preferably, deionized water), because some combinations of amines and amino acids tend to form a complex which is least soluble in organic solvents depending on a molar ratio of these two components. In that case, water is helpful to stabilize the stripper solution without precipitation. However, if water is added too much, it may work as a precipitation enhancer to resist components at the same time. Therefore, the desirable amount of water in the stripper composition is between 0 and 10% by weight based on the total weight of stripper solution. It should be noted that the presence of the amino acid will prevent corrosion occurring, even when water is present in the stripping composition.

The preferred amounts of these four ingredients are about 40–65% polar solvent; about 25–60% amine compound; about 0.03–0.7% novolak resin; optionally about 1–5% amino acid corrosion inhibition, and optionally about 1–5% water, all based on the weight of the stripper composition.

Various other ingredients known to those skill in the art may optionally be included in the stripping composition e.g. dyes or colorants, wetting agents, surfactants, antifoamers and so forth. Generally, an amount of each of these optional ingredients would be about 0.1–0.5% by weight, based on the total stripper composition.

The described stripping composition is used in removing an organic polymeric material from a substrate. The method of the invention is carried out by contacting an organic polymeric material with the described stripping composition. The actual conditions, i.e., temperature, time, and the like, may vary over wide ranges and are generally dependent on the nature and thickness of the organic polymeric material to be removed, as well as other factors familiar to those skilled in the art. In general, however, temperatures ranging from about 25° C. to about 100° C. for a period of about 10 minutes to about 60 minutes are typical.

A variety of means can be employed in contacting the organic polymeric material with the stripping composition in the practice of the invention. For example, the substrate containing the organic polymeric material can be immersed in a stripping bath or the stripping composition can be sprayed over the surface of the organic polymeric material, as will be apparent to those skilled in the art.

The stripping composition of the invention is effective in removing a wide variety of organic polymeric materials from substrates. Exemplificative organic polymeric materials include positive- and negative-working g/i-line and deep UV resists, electron beam resists, X-ray resists, ion beam resists, as well as organic dielectric materials such as polyimide resins, and so forth. Specific examples of organic polymeric materials which can be removed in the practice of the invention include positive resists containing phenol formaldehyde resins or poly(p-vinylphenol); negative resists containing cyclized polyisoprene or poly(p-vinylphenol);

and polymethylmethacrylate-containing resists. In particularly preferred embodiments of the invention, the stripping composition has been found to be highly effective in removing positive resists containing a novolak resin and a diazo ketone sensitizer, e.g., ortho naphthoquinone diazide sulfonic acid ester; resists of this type include HPR 204 POSITIVE RESIST, HPR 504 POSITIVE RESIST, and HPR 6500 Series POSITIVE RESIST, all available commercially from OCG Microelectronic Materials, Inc. The organic polymeric material can be removed from any of the conventional substrates known to those skilled in the art, such as silicon, silicon dioxide, silicon nitride, polysilicon, aluminum, aluminum alloys, copper, copper alloys, and so forth.

The present invention is further described in detail by means of the following Examples and Comparisons. All parts and percentages are by weight and all temperatures are degrees Celsius unless explicitly stated otherwise.

EXAMPLES

Silicon wafers, 125 mm in diameter, were used for the following stripping tests which were carried out at 90° C. for 10 minutes in a quartz tank without recirculation or filtration. After the processing, the wafers were immediately rinsed with deionized water in an overflow tank for 10 minutes at room temperature and spun dry.

The stripping efficiency was determined by measuring the amount of residues left on the wafers after the removal of a photoresist film casted with a stripper solution which consists of N-methylpyrrolidone (NMP), 50 g, 2-(2-aminoethoxy)ethanol (AEE), 50 g, and m-cresol/p-cresol/3,5-xylenol copolymer type of novolak resin having $M_w=2,000$, 1.0 g. For this measurement, OCG positive i-line photoresist, OiR32, was spun coated on the wafers, exposed, developed, and hard baked at 150° C. for 15 minutes. The remaining residues on the wafers after the stripping were detected as Light Point Defect (LPD) with a Censor ANS100 light scattering equipment to evaluate the stripping efficiency. LPD's which are bigger than 0.15 micron in diameter were measured as residual LPD.

The particle uptake with uncoated wafers was also measured as added LPD in the same way as described above.

The metallic contamination on the wafers was evaluated by using a total reflection X-ray fluorescence spectrometer (TXRF) according to the method published by P. W. Mertens et al., in Proc. 38th Annual Meeting of the IES (1992) pp. 475–482.

The results are summarized in Table 1 in comparison with Comparison 1 in which NMP/AEE (50:50) admixture was used without any additive. These results indicate that the addition of the novolak results in a significant reduction of the particle level, as well as the metal level on the wafer.

TABLE 1

|  | Residual LPD (#/wafer) | Added LPD (#/wafer) | Metal (× 10⁹ atom/cm²) | |
|---|---|---|---|---|
|  |  |  | Fe | Cu |
| Example 1 | 400 ± 100 | 300 ± 100 | 2.0 | 1.0 |
| Compar. 1 | 1,000 ± 100 | 200 ± 100 | 60.0 | 10.0 |

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A resist stripper composition comprising:

(a) from about 20 to about 70% by weight of an organic polar solvent having a dipole moment of more than 3.5;

(b) from about 70 to about 20% by weight of an amine compound selected from the group consisting of compounds having the formula (I):

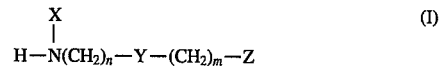

wherein n and m are each independently an integer ranging from 0–5, inclusive; X is hydrogen, alkyl, or alkoxy group; Y is either —O— or —NH—; and Z is hydrogen, —OH, or —NH₂;

(c) about 0.01% to about 1% by weight of novolak resin having a weight average molecular weight ($M_w$) from about 200 to about 5,000;

(d) optionally from about 0 to about 10% by weight of an amino acid selected from the group consisting of compounds having the formula (II):

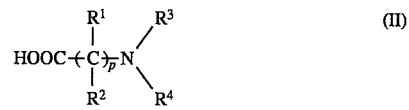

wherein n is an integer ranging from 1–3; $R^1$ and $R^2$ are each independently selected from the group consisting of hydrogen and compounds having the formula

wherein $R^5$, $R^6$, and $R^7$ are each independently selected from hydrogen, —OH, —CH₂OH, alkyl, alkoxy, phenyl, and mono-, di- or tri-hydroxy-substituted phenyl groups; and $R^3$ and $R^4$ are each independently selected from the group consisting of hydroxy and compounds having the formula (IV):

wherein X', Y', and Z' are each independently selected from hydrogen, —OH, —CH₂OH, —CH₂CH₂OH, —CH₂COOH, alkyl, or alkoxy group, and at least one of them is —OH, —CH₂CH₂OH, or —CH₂OH; and (e) optionally from about 0 to about 10% by weight of water.

2. The stripper composition of claim 1 wherein said solvent (a) is a cyclic amide.

3. The stripper composition of claim 2 wherein said cyclic amide is selected from the group consisting of N-alkyl-2-pyrrolidone, N-hydroxyalkyl-2-pyrrolidone, and 1,3-dialkyl-2-imidazolidinone.

4. The stripper composition of claim 1 wherein said amine (b) is an alkanolamine.

5. The stripper composition of claim 4 wherein said alkanolamine is selected from the group consisting of monoethanolamine, 2-(2-aminoethoxy)ethanol, 2-(2-aminoethylamino)ethanol, diethanolamine, and triethanolamine.

6. The stripper composition of claim 1 wherein said novolak resin is an addition-condensation products of a monomeric phenolic compound selected from the group consisting of phenol, o-cresol, m-cresol, p-cresol, 2,3-xylenol, 2,5-xylenol, 3,5-xylenol, 2,3,5-trimethylphenol, and admixtures thereof with an aldehyde source selected from the group consisting of formaldehyde, paraformaldehyde, benzeldehyde, acetaldehyde, and admixtures thereof.

7. The stripper composition of claim 6 wherein said novolak resin is present in an amount of 0.03–0.7% by weight in said stripper composition.

8. The stripper composition of claim 1 wherein said amino acid is selected from the group consisting of: tricine, bicine, DL-homoserine, D-homoserine, L-homoserine, DL-threonine, D-allo-threonine, L-allothreonine, D-threonine, L-threonine, DL-3-hydroxynorvaline, DL-metathroxine, DL-tyrosine, D-tyrosine, L-tyrosine, 3-(3,4-dihydroxyphenyl)-DL-alanine, 3-(3,4-dihydroxyphenyl)-L-amine, 3-(2,4,5-trihydroxyphenyl)-DL-alanine, DL-alpha-methyltyrosine, L-alphamethytyrosine, (–)-3-(3,4-dihydroxyphenyl)-2-methyl-L-alanine DL-threo-3-phenylserine, and DL-threo-3,4-dihydroxyphenylserine.

9. The stripper composition of claim 8 wherein said amino acid is selected from the group consisting of tricine, bicine, 3-(2,4,5-trihydroxyphenyl)-DL-alanine, and DL-threo-3,4-dihydroxyphenylserine.

* * * * *